(12) United States Patent
Jimbo et al.

(10) Patent No.: US 6,642,583 B2
(45) Date of Patent: Nov. 4, 2003

(54) CMOS DEVICE WITH TRENCH STRUCTURE

(75) Inventors: Shinichi Jimbo, Nagano (JP); Jun Saito, Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 10/166,575

(22) Filed: Jun. 11, 2002

(65) Prior Publication Data

US 2002/0195659 A1 Dec. 26, 2002

(30) Foreign Application Priority Data

Jun. 11, 2001 (JP) ........................................ 2001-175579

(51) Int. Cl.[7] ............................................ H01L 27/092
(52) U.S. Cl. ........................ 257/372; 257/374; 257/376
(58) Field of Search ................................ 257/372, 374, 257/376

(56) References Cited

U.S. PATENT DOCUMENTS 4,805,008 A * 2/1989 Yao et al. .................... 257/376
4,862,240 A * 8/1989 Watanabe et al. ........... 257/374
5,446,300 A   8/1995 Amato et al. ................ 257/343
5,726,476 A * 3/1998 Kim .......................... 257/372
5,801,423 A * 9/1998 Manning ..................... 257/372

FOREIGN PATENT DOCUMENTS

JP    2000-058673    2/2000

* cited by examiner

Primary Examiner—Gene M. Munson

(57) ABSTRACT

A semiconductor device is provided having a high voltage driver IC reducing malfunction or device destruction. A high voltage IC chip includes a trench structure that surrounds each of two semiconductor regions at different electrical potentials. Specifically, a first semiconductor region forms a ground-potential-based circuit, and a high voltage junction terminating structure around a second semiconductor region forms a floating-potential-based circuit. A trench structure is formed after digging a trench by implanting a high concentration p+ region on a trench wall, or alternatively, by filling the trench with a p+ doped polysilicon or with a dielectric.

16 Claims, 14 Drawing Sheets

CMOS DEVICE WITH TRENCH STRUCTURE

CROSS-REFERENCE TO RELATED APPLICATIONS

This application claims the benefit of Japanese Application No. JP 2001-175579, filed Jun. 11, 2001 in the Japanese Patent Office, the disclosure of which is incorporated herein by reference.

BACKGROUND OF THE INVENTION

1. Field of the Invention

The present invention relates to a semiconductor device used as a high voltage driver to drive and control a power supply or other equipment.

2. Description of the Related Art

An integrated circuit used as a high voltage driver to drive and control a power supply generally includes a structure to isolate a high voltage portion from a low voltage portion.

Commonly used types of isolating structures include junction a isolation structure using a pn junction and a dielectric isolation structure using a dielectric, such as $SiO_2$. In the junction isolation, a p-type substrate, for example a wafer, may be used having a low concentration n-type epitaxial layer formed on a surface of the wafer. A deep p-type diffusion region is formed in the epitaxial layer to form an n-type island that is three dimensionally divided by a pn junction. A driver circuit including a CMOS for example, is fabricated in the n-type island. A high breakdown voltage is achieved by applying reverse voltage between the n-type island and the p-type substrate to electrically isolate the n-type island using a junction capacitance.

In the dielectric isolation, silicon n-regions are formed that are electrically isolated each other by $SiO_2$ selectively formed in a silicon substrate. An electric circuit is formed in each silicon n-region, where the electric circuit operating at a different base potential from a base potential of the other silicon n-regions. Thus, a high breakdown voltage is achieved in the dielectric isolation.

Japanese Unexamined Patent Application Publication No. H9-55498 discloses a method for junction isolation, in which only a planar junction performs isolation using a conventional silicon wafer, without using an epitaxial wafer that is commonly used in junction isolation. This isolation structure can be regarded as a kind of self-isolation structure. Japanese Unexamined Patent Application Publication No. 2000-58673 discloses a structure combining junction isolation and trench isolation and a trench isolation structure that forms an insulating layer along the surface of a trench.

The junction isolation structure needs relaxation of an electric field concentration at the pn junction appearing on the substrate surface. A commonly used method for the relaxation is a RESURF (reduced surface electric field) structure.

When a reverse bias potential is applied between an isolated n-type region and a p-type substrate, a parallel plane junction corresponding to a bottom of the planar junction develops a depletion layer parallel to the substrate surface. However, an end portion of the n-type region hardly extends the depletion layer and tends to generate the electric field concentration. The RESURF structure sets the impurity concentration in the end portion of the n-type region to a low value so as to facilitate expanding the depletion layer in this portion.

Another structure called double RESURF structure is also used for the terminating structure. A feature of the double RESURF structure is addition of a low concentration p– region on the surface of the end portion of the n-type region compared to the single RESURF structure. When a reverse potential is applied between a isolated n-type region and a p-substrate of the double RESURF structure, depletion layers expand from both the p– region on the surface region and the p-substrate in the end portion of the n-type region.

The following describes an example of a specific construction and operation of an integrated circuit having the double RESURF structure. FIG. 9 is a plane view of an example of a construction of a conventional high voltage driver integrated circuit.

The high voltage driver of FIG. 9 has the double RESURF structure. A high voltage IC chip 90 includes three regions 901 forming floating-potential-based circuits for a U-phase, a V-phase, and a W-phase of an upper arm and a region 902 forming a ground-potential-based circuit.

Each of the regions 901 forming the floating-potential-based circuits is surrounded by a high voltage junction terminating structure 903. FIG. 10 is a cross-sectional view showing a structure along a line B–B' in the conventional integrated circuit of FIG. 9.

FIG. 11 is a cross-sectional view showing a structure along a line C–C' in the conventional integrated circuit of FIG. 9. The conventional integrated circuit illustrated in FIGS. 10 and 11 includes a region 901 forming a floating-potential-based circuit formed in an n-region 92 U-phase in the surface region of a p-substrate 910 and a p– region 902 forming a ground-potential-based circuit formed in an n-region 702. The p– region 902 is formed in a surface region of a p+ region 801.

Each of the n-region 92 and the n-region 702 contains various semiconductor devices composing a control circuit. As examples of such semiconductor devices, FIGS. 10 and 11 show a P-MOS (P channel MOS transistor) and an N-MOS (N channel MOS transistor) in each of the n-regions.

A symbol Vcc in the n-region 702 indicates a wiring of a power supply of the lower arm (not shown). An electric potential of the wiring Vcc with respect to the ground potential GND is usually in a range from 10 to 20 volts, for example.

A high voltage junction terminating structure 903 is formed around the n-region 92 and the n-region 98 that is adjacent to the n-region 92. The n-region 98 is occasionally formed simultaneously in a process forming the n-region 92.

A symbol $V_{UL}$ in the n-region 92 indicates a base potential of the floating-potential-based circuit, and a symbol $V_{UH}$ indicates a power supply potential of the floating-potential-based circuit. The voltage of an upper arm power supply is given by $V_{UH}$–$V_{UL}$ that is a potential difference between the potential $V_{UH}$ and the potential $V_{UL}$. The voltage $V_{UH}$–$V_{UL}$ is set to a value between 10 and 20 volts, for example.

A wiring at the base potential $V_{UL}$ connects to a midpoint of two IGBTs in upper and lower arms that are driven by the high voltage driver circuit. More specifically, the midpoint is the point at which an emitter of an upper arm IGBT and a collector of a lower arm IGBT join together. The base potential $V_{UL}$ changes rapidly in the switching process of the IGBT between 0 and 600 V for an IC of a withstand voltage of 600 V-class, or between 0 and 1,200 V for an IC of a withstand voltage of 1,200 V-class. A variation rate dV/dt of the potential $V_{UL}$ rises up to 10 to 20 kV/ps in some cases.

FIG. 9 shows a three phase driver IC, which has two other n-type regions for a V-phase and a W-phase having the floating-potential-based circuits on the p-substrate 910 as well as the n-region 92 for the U-phase. The base potentials VVL and VWL in these n-type regions for V- and W-phases also change rapidly in the switching process of the IGBTs like the potential $V_{UL}$ in the n-region 92 for the U-phase. Junction capacitance exists at each pn junction formed in the above-described conventional integrated circuit, which implies existence of a type of capacitor.

When a voltage with a rapidly changing waveform dV/dt is applied to this capacitor, a charging current or a displacement current C×dV/dt flows at a whole surface of the pn junction, where C is a capacitance of the capacitor. This charging current drives the parasitic transistors 911 and 912 shown in FIGS. 10 and 11, as described below. This may cause malfunction of the circuit and device destruction, which has been a problem with the conventional integrated circuit.

FIG. 12 is a cross-sectional view along the line B–B' of FIG. 9 showing the conventional integrated circuit, to which an example of a latch-up current is added. FIG. 13 is a cross-sectional view along the line C–C' of FIG. 9 showing the conventional integrated circuit, to which an example of the latch-up current is added.

In the conventional self-isolation structure, latch-up current indicated by a thick line in FIGS. 12 and 13 may flow along a parasitic thyristor consisting of the p-region 93, the n-region 92, the p-substrate 910, and the n-region 702. FIG. 14 is a cross-sectional view at a portion corresponding to the line B–B' of FIG. 9 of the conventional integrated circuit, in which a means to avoid the latch-up current is provided.

In the conventional integrated circuit shown in FIG. 14, a deep guard-ring is formed surrounding the diffusion regions constituting an elementary device by means of an ion implantation followed by thermal diffusion. Because making the deep guard-ring involves lateral extension of the diffusion area of the guard-ring, a distance between the diffusion n-regions in adjacent elementary devices need to be enlarged.

This situation causes a large chip size. Therefore, this conventional isolation means is unfavorable. The conventional dielectric isolation structure does not cause the above-described parasitic action because the parasitic thyristor and a parasitic transistor do not exist in the structure. However, the structure suffers from high costs due to wafer processing.

Junction isolation structure allows adjusting impurity concentration and a depth of the isolation region more easily than a self-isolation structure by using the epitaxial wafer. Accordingly, a construction can be produced that avoids parasitic action. However, the manufacturing cost for the epitaxial wafer is higher than that for a non-epitaxial wafer in the self-isolation structure.

The combined structure of the junction isolation and the trench isolation that is disclosed in Japanese Unexamined Patent Application Publication No. 2000-58673 can not be applied to a high voltage IC that needs isolation between a high potential portion and a low potential portion in one chip at a potential difference of 600 to 1,200 volt classes.

In the known trench isolation structure, only such a type has been provided, in which a dielectric layer is formed along a trench wall. However, a type of trench isolation structure that is employed in a semiconductor device according to the present invention has never been disclosed, in which a conductive film on the trench wall or a polysilicon is buried in trench contacts with a p-substrate near the trench.

SUMMARY OF THE INVENTION

The present invention has been made in view of the above-described problems in the conventional integrated circuits, and according to the invention a semiconductor device is provided applicable to a high voltage driver that hardly suffers from malfunction or device destruction.

At first, an integrated circuit structure using the combination of the self-isolation structure and the trench isolation structure will be described. Specifically, a deep trench is formed in a surface region of a p-substrate surrounding diffusion regions that may become at a different electric potential from other regions. Examples for such diffusion regions are high voltage junction terminating structure and a region for forming a ground-potential-based circuit.

At first, an integrated circuit structure using the combination of the self-isolation structure and the trench isolation structure will be described. Specifically, a deep trench is formed in a surface region of a p-substrate surrounding diffusion regions that may become at a different electric potential from other regions. Examples for such diffusion regions are high voltage junction terminating structure and a region for forming a ground-potential-based circuit.

Then, one of the following three procedures is executed on the trench. (1) A high concentration p+ type region is formed on an inner wall of the trench formed in the surface region of the p-substrate. A conductive film, which is an electrode made of metal, for example, is formed on the surface of the p+ type region. The conductive film is grounded so that an electric potential of the conductive film equals the potential of the p-substrate near the trench, the latter potential being at a ground (GND) level. As a result, the potential of the conductive film, that is, a potential of the high concentration p+ type diffusion layer is held at the ground potential level, which is lower than, for example, the potential of Vcc in a region forming a ground-potential-based circuit.

(2) The trench is filled with a high concentration of p+ type silicon. This p+ type silicon is then heat-treated to reduce an electrical resistance and to ensure an electrical connection of the p+ type silicon to the p-substrate. An electrode is attached onto a top surface of the p+ type silicon and grounded so that a potential of this electrode equals a potential of the p-substrate near the trench, which is at the electrical potential level of the ground. As a result, the potential of the high concentration p+ type silicon is held lower than, for example, the potential of the n-type region 202 that forms the region forming a ground-potential-based circuit.

(3) The trench is filled with a dielectric. This structure can be regarded as a fusion of a self-isolation structure and a dielectric isolation structure. As a result, this structure is advantageous in manufacturing costs compared with manufacturing an entire structure by the dielectric isolation.

Next, the integrated circuit structure combining junction isolation structure and trench isolation will be described. This structure accomplishes isolation between regions by forming a trench in an epitaxial layer. Then, one of the above-described three procedures is executed on the trench.

These together with other objects and advantages, which will be subsequently apparent, reside in the details of construction and operation as more fully hereinafter described and claimed, reference being had to the accompanying drawings forming a part thereof, wherein like numerals refer to like parts throughout.

BRIEF DESCRIPTION OF THE DRAWINGS

The above-mentioned object and the feature of the present invention will be more apparent by describing the preferred embodiment of the present invention by referring to the appended drawings, in which.

DETAILED DESCRIPTION OF THE PREFERRED EMBODIMENTS

Hereinafter, embodiments of the present invention will be described in detail with reference to the attached drawings. The present invention may, however, be embodied in many different forms and should not be construed as being limited to the embodiments set forth herein; rather, these embodiments are provided so that the present disclosure will be thorough and complete, and will fully convey the concept of the invention to those skilled in the art.

A First Aspect of an Embodiment of the Invention.

Figure 1:
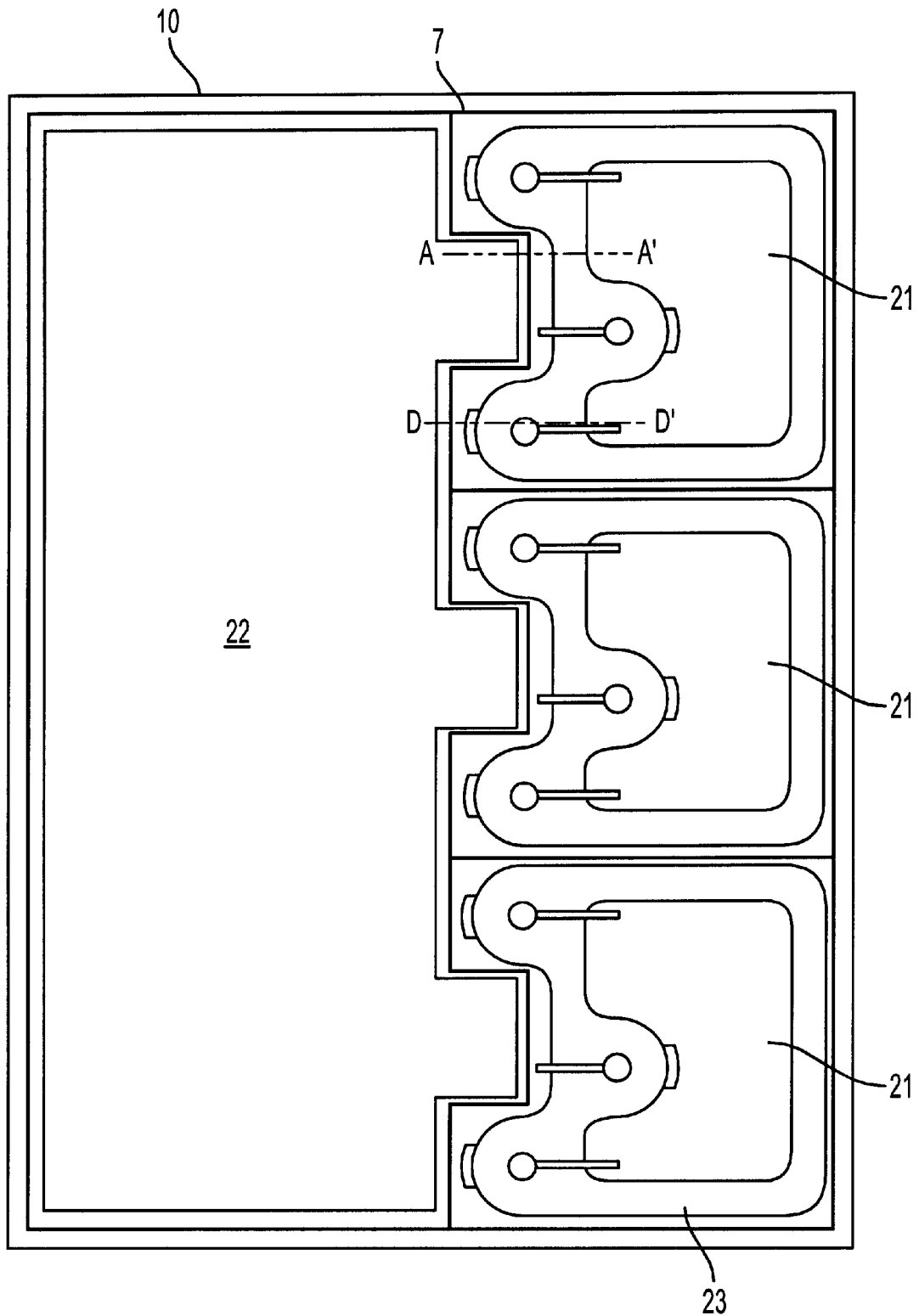
FIG. 1 is a plane view of an example of a structure of a high voltage driver integrated circuit according to a first aspect of an embodiment of the present invention.

FIG. 1 is a plane view of an example of a high voltage driver integrated circuit according to a first aspect of an embodiment of the present invention.

A high voltage IC chip 10 includes regions 21 forming floating-potential-based circuits for upper arms of three phases, U-, V-, and W-phases, and a region 22 forming a ground-potential-based circuit. Each region 21 forming the floating-potential-based circuit is surrounded by a high voltage junction terminating structure 23.

Figure 2:
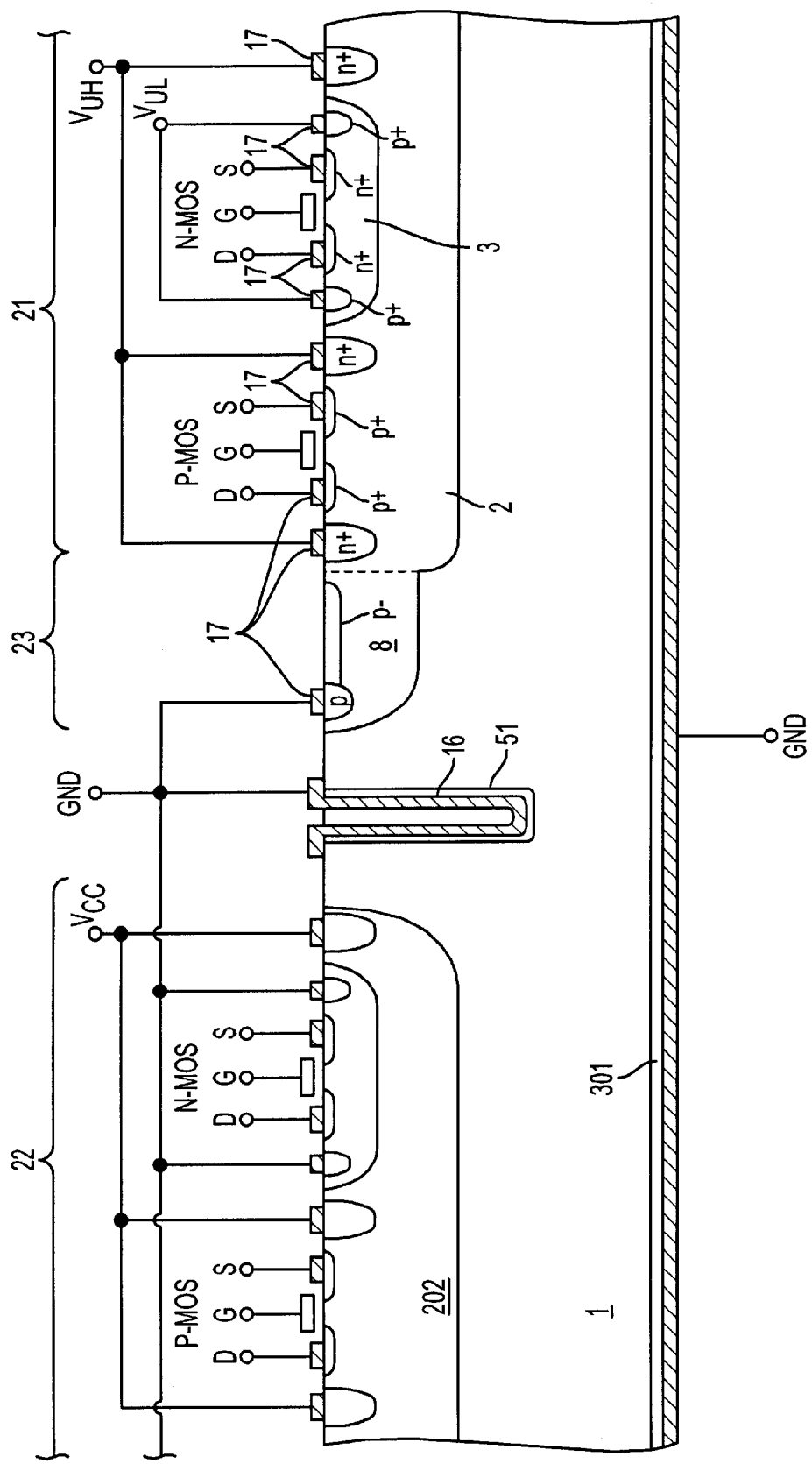
FIG. 2 is a cross-sectional view along a line A–A' of FIG. 1 of the high voltage driver integrated circuit according to the first aspect of an embodiment of the present invention.

A double RESURF structure may be employed for the high voltage junction terminating structure 23 of the high voltage driver of FIG. 1. FIG. 2 is a cross-sectional view along a line A–A' of FIG. 1 of the high voltage driver integrated circuit according to the first aspect of an embodiment of the present invention.

In the integrated circuit shown in FIG. 2, an n-region 2 for a U-phase is formed in a surface region of a p-substrate 1. The p-substrate 1 is formed in a surface region of a p+ region 301. The region 21 forming the floating-potential-based circuit is formed in the n-region 2. A region 22 forming the ground-potential-based circuit is formed in an n-region 202.

The high voltage junction terminating structure 23 is formed in a periphery of the n-region 2. The terminating structure 23 is formed in an n-region 8 that contacts the n-region 2. FIG. 2 shows a P-MOS and an N-MOS in the n-region 2 and the n-region 202 as examples of semiconductor elementary devices in a control circuit. In more detail, the P-MOS is formed directly in the n-region 2. The N-MOS is formed in the p– region 3 that is formed in the n-region 2. However, the high voltage driver integrated circuit according to the invention may contain any number of N-MOS and P-MOS transistors in each of the n-regions 2 and 202.

Symbols D, G, and S represent a drain electrode, a gate electrode, and a source electrode, respectively, of the P-MOS or the N-MOS. Each gate electrode G is formed on a surface of an appropriate region through an insulating film.

Although a conductivity type of each region within the n-region 202 is not shown in the FIG. 2, the conductivity type of each region in the n-region 202 is the same as that of corresponding regions in the n-region 2. A trench structure 7 is provided around the high voltage junction terminating structure 23 that is adjacent to the region 21 to form the floating-potential-based circuit and around the region 22 to form the ground-potential-based circuit in the integrated circuit of the invention, as shown in FIG. 1. The trench structure 7 of the first aspect of an embodiment of the present invention is formed as follows. A trench is formed surrounding the high voltage junction terminating structure 23 and the region 22 forming a ground-potential-based circuit. On a side wall of the trench, a trench wall p+ region 51, that is a high concentration p+ region, is formed. Then, an electrode 16 is formed by sputtering or CVD a material containing metal, such as aluminum, to make contact with the trench wall p+ region 51. Since the trench wall p+ region 51 electrically connects to the p-substrate 1, the trench wall p+ region 51 is at a same electrical potential as the p-substrate 1.

Therefore, the potential of the trench wall p+ region 51 is held lower than the potential of the n-region 202. The symbol Vcc in the n-region 202 represents the wiring of the power supply for the lower arm a range from +10 to 20 V, for example.

An effect of the trench wall p+ region 51 is as follows. The structure of FIG. 2 also includes a parasitic thyristor with a pnpn structure including a p– region 3, an n-region 2, a p-substrate 1, and an n-region 202. When a rapidly varying voltage is applied to the p– region 3, displacement current $C \times (dV/dt)$ proportional to a junction capacitance C flows through a junction of the n-region 2 and the p-substrate 1. Charging current corresponding to the displacement current flows in the p-substrate 1 that develops a portion in the p-substrate where the electric potential is higher than a ground level GND. A large dV/dt increases the charging current, which in turn elevates the potential of the p-substrate 1. If the potential of the p-substrate reaches a level at which the p-substrate is forward-biased with respect to the n-region 202, a gate current of the parasitic thyristor begins to flow. When the gate current flows up to a certain value, the parasitic thyristor turns on and a latch-up occurs, even if the potential difference between the p– region 3 corresponding to an anode and the n-region 202 corresponding to a cathode is lower than a breakover voltage of the parasitic thyristor. The latch-up may cause overcurrent flow leading to a destruction of the semiconductor device. In the structure in FIG. 2, however, the electrode 16 formed on the trench wall p+ region 51 plays a roll of a gate electrode. By connecting the electrode 16 to the GND and fixing the potential of the electrode to the ground level, a portion of the charging current that flows into the trench increases and the current that flows in the p-substrate around the n-region 202 diminishes, which suppresses a potential elevation at the p-substrate around the n-region 202 and prevents the forward bias between the p-substrate 1 and the n-region 202 from developing to avoid flow of the gate current of the parasitic thyristor. Therefore, the latch-up of the parasitic thyristor is hard to occur in this structure.

A symbol $V_{UL}$ in the n-region 2 represents a base potential in the floating-potential-based circuit, and $V_{UH}$ represents a power supply potential of the floating-potential-based circuit. A voltage of an upper arm power supply is given by a difference of the potentials $V_{UH}$ and $V_{UL}$, that is, $V_{UH} - V_{UL}$, and usually a used voltage is in a range from +10 to 20 volts, for example.

A wiring at the base potential $V_{UL}$ may be connected to a midpoint of two IGBTs in the upper and lower arms that are driven by the high voltage driver circuit. More specifically, the midpoint is the point at which the emitter of the upper arm IGBT joins the collector of the lower arm IGBT.

FIG. 1 illustrates a three-phase driver IC, where the p-substrate 1 contains two more n type regions for V- and W-phases, each including a floating-potential-based circuit, as well as the n-region 2 for the U-phase described above referring to FIG. 2.

The high voltage junction terminating structure 23 includes an n-region 8 formed adjacent to the n-region 2 and an adjoining region of p- and p type portions formed in the surface region of the n-region 8. The n-region 8 may be formed simultaneously with a process forming the n-region 2.

The terminating structure 23 includes two pn junctions: a first pn junction between the p-substrate 1 and the n-region 8, and a second pn junction between the n-region 8 and the adjoining region of the p- and p type portions. First and second depletion layers expand to both sides from the first and the second pn junctions, respectively. The adjoining region of the p- and p type portions may be formed such that the two depletion layers join together in the n-region 8 and further, the second depletion layer extends to a surface of the adjoining region when both, the two pn junctions are reversely biased. The structure of the high voltage junction terminating structure 23 may be modified to various structures.

Figure 3:
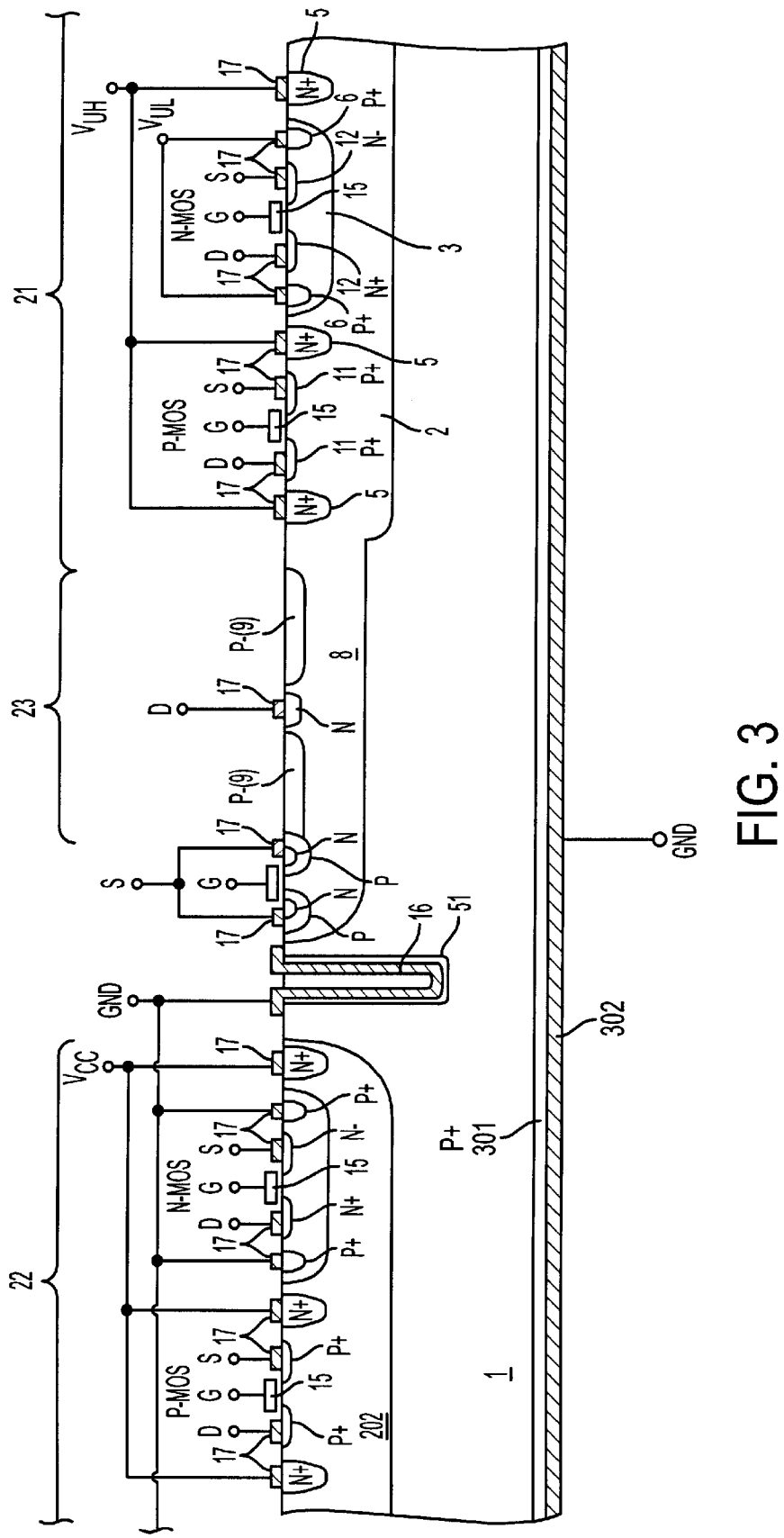
FIG. 3 is a cross-sectional view along a line D–D' of FIG. 1 showing a variation of the high voltage driver integrated circuit according to the first aspect of an embodiment of the present invention.

A possible variation for the terminating structure 23 arranges a high voltage MIS (metal insulator semiconductor) transistor including a third drain electrode in one side of the adjoining region of p- and p portions, and a third source electrode and a third gate electrode in another side of the adjoining region. This variation is shown in FIG. 3, which is a cross-sectional view along the line D–D' of FIG. 1. In the structure of FIG. 3, an n type high concentration region, which is the third drain region, is provided surrounded by the p– region 9 in the n-region 8. Outside the p– region 9 in the trench side the third gate electrode, source region, and the third source electrode are provided.

The following further describes possible construction of the integrated circuit according to the first aspect of embodiment. A third depletion layer expands in the n-region 2 from a third pn junction formed between the p-substrate 1 and the n-region 2, when a reverse bias voltage is applied to the third pn junction. The p-substrate 1 is formed in the surface region of a p+ region 301 over a bottom surface 302 of the IC chip 10. The thickness and the impurity concentration of the n-region 2 may be selected such that a front of the third depletion layer does not reach the p– region 3 when a reverse bias is applied to the third pn junction.

A method has been described above to hold the electrical potential of the trench wall p+ region 51 lower than the potential of the n-region 202. Vbi is a built-in potential between the p-substrate and the n-region 202, and V1 is a potential in the p-substrate 1 at a front of a fourth depletion layer extending from a fourth pn junction formed between the p-substrate and the n-region 202, and a fourth pn junction being biased by the voltage Vcc. The trench structure may be formed such that an inequality V1<Vcc+Vbi holds throughout the operating condition. The trench structure may be formed to surround the n-region 2. The trench structure may be formed to surround the n-region 202.

A Second Aspect of an Embodiment of the Invention.

Figure 4:
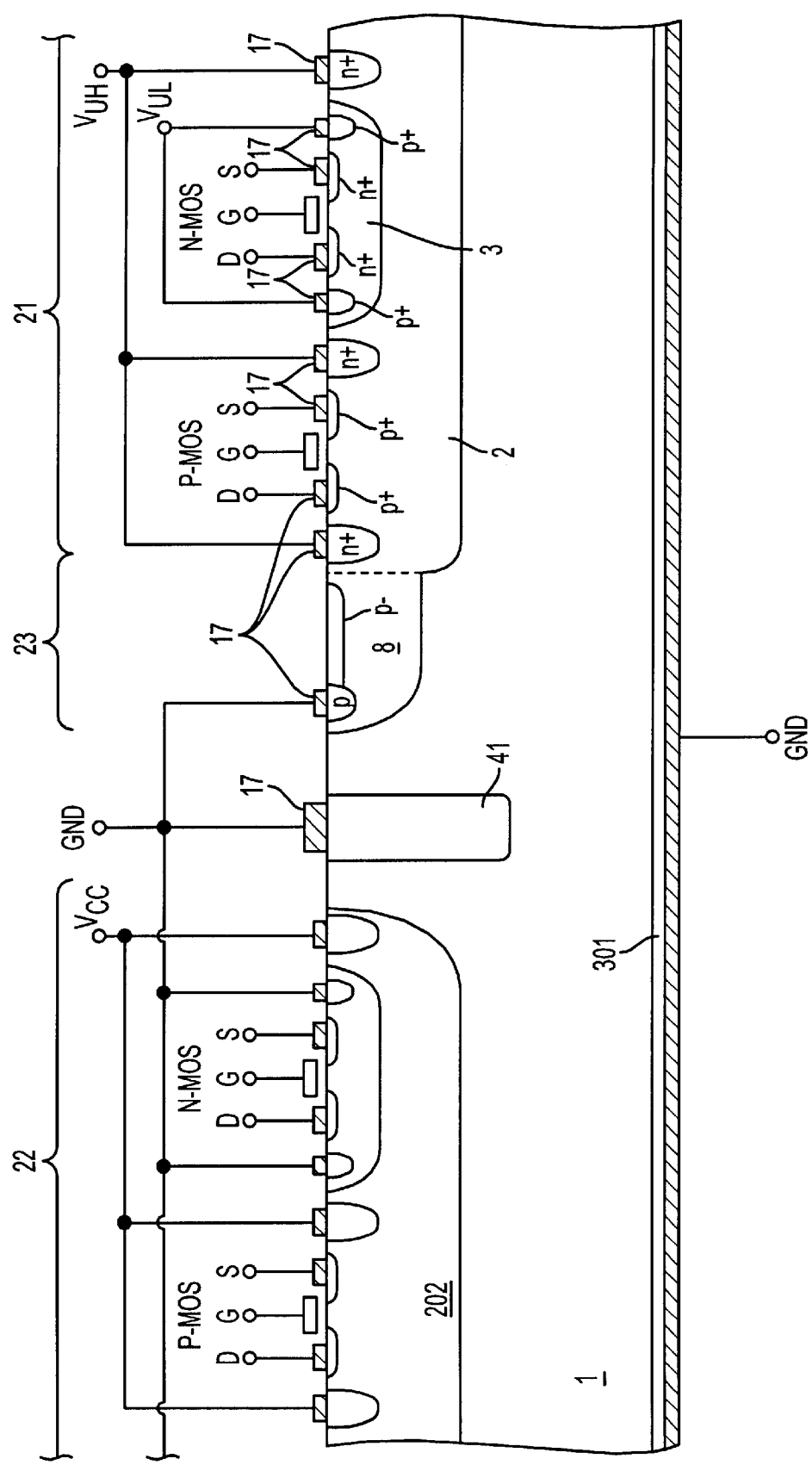
FIG. 4 is a cross-sectional view of an example of a structure of the high voltage driver integrated circuit according to a second aspect of an embodiment of the present invention.

FIG. 4 is a cross-sectional view of an example of the high voltage driver integrated circuit according to a second aspect of an embodiment of the present invention.

A structure of the integrated circuit according to the second aspect of embodiment only differs in the trench structure 7 from the structure of the integrated circuit of the first aspect shown in FIGS. 1 and 2. The remaining structure and fabrication method are same as the integrated circuit of the first aspect of the present invention.

The trench structure 7 in the second aspect of an embodiment of the present invention also surrounds a region 22 to form the a ground-potential-based circuit and a high voltage junction terminating structure 23 adjacent to the region 21 to form a floating-potential-based circuit as shown in FIG. 1. Here, the trench structure 7 in the second aspect is formed by first digging a trench, then filling the trench with p+ doped polysilicon by means of a CVD to form a buried p+ region 41. After that, a metal electrode 17 is formed to make contact with the buried p+ region 41. By connecting the electrode 17 to the GND, the electric potential of the buried p+ region 41 is made to be the ground potential level, which is the same potential as of the p-substrate 1. In the first aspect of an embodiment of the present invention, a metal electrode is formed in the trench and the trench width is about 5 µm, while the depth of the trench is about 5 µm or more.

In the second aspect of an embodiment of the present invention, the trench is filled with only polysilicon and the trench width of about 2 µm is enough, thus facilitating further miniaturization of the semiconductor device. The electrical potential of the buried p+ region 41 is held at the ground potential level, which is lower than the potential of the n-region 202. A region with high concentration p type doping may be further formed in the surface region of the p-substrate adjacent to the polysilicon in the trench.

A Third Aspect of an Embodiment of the Invention.

Figure 5:
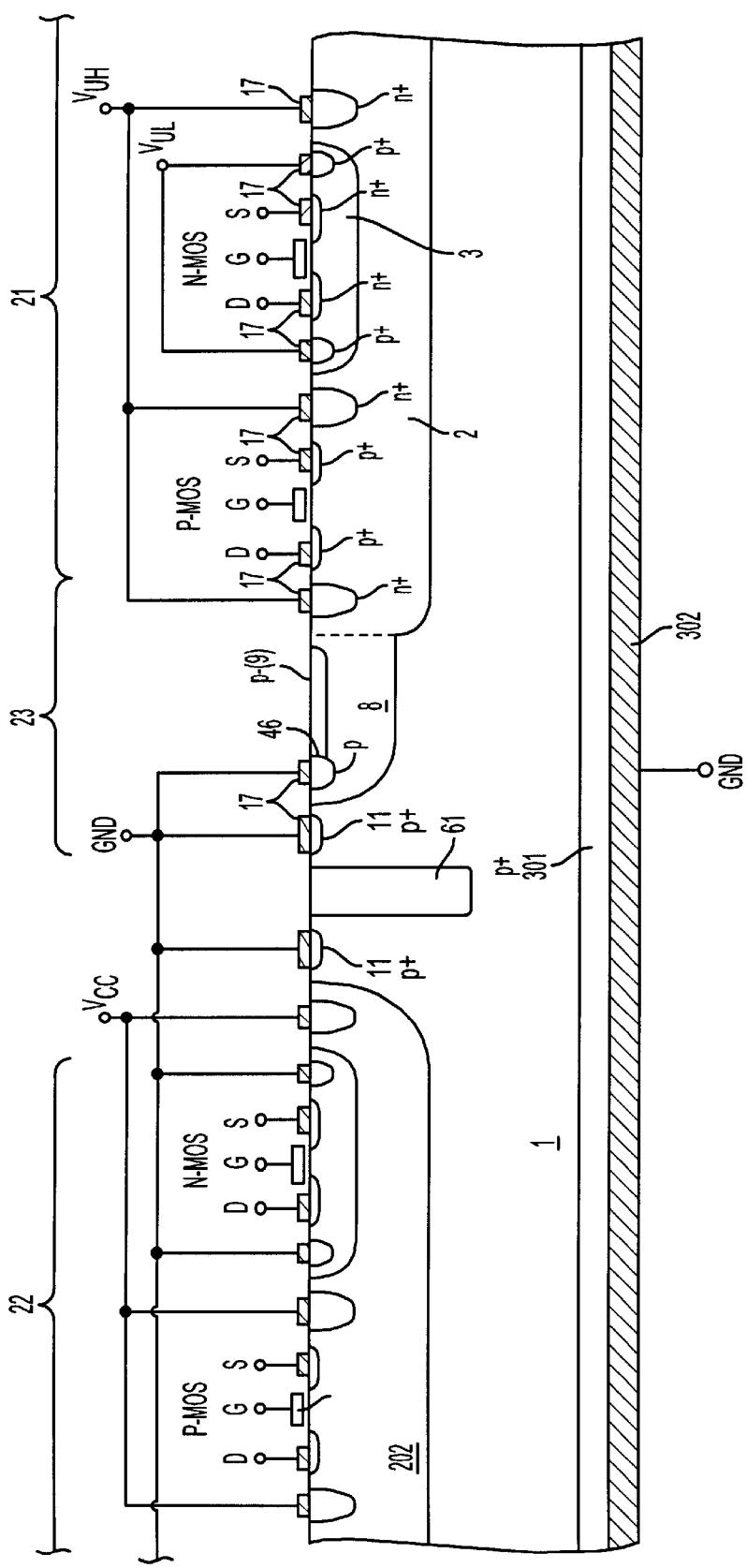
FIG. 5 is a cross-sectional view of an example of a structure of the high voltage driver integrated circuit according to a third aspect of an embodiment of the present invention.

FIG. 5 is a cross-sectional view of an example of the high voltage driver integrated circuit according to the third aspect of an embodiment of the present invention.

A structure of the integrated circuit according to the third aspect of embodiment only differs in the trench structure 7 from the structure of the integrated circuit of the first aspect shown in FIGS. 1 and 2. The remaining structure and fabrication method are same as the integrated circuit of the first aspect of the present invention. The trench structure 7 in the third aspect of an embodiment of the present invention also surrounds the region 22 to form the ground-potential-based circuit and the high voltage junction terminating structure 23 adjacent to the region 21 to form a floating-potential-based circuit as shown in FIG. 1. Here, the trench structure 7 in the third aspect is formed by first digging a trench, then filling the trench with a dielectric 61. Then, high concentration p+ regions 11 are formed in the surface region of the p– region 1 at both sides of the trench filled with the dielectric 61, and the p+ regions are connected to the GND with the electrodes 17. This structure prevents the electric potential of the p– region 1 from rising, suppressing the latch-up of a parasitic thyristor.

A Fourth Aspect of an Embodiment of the Invention.

Figure 6:
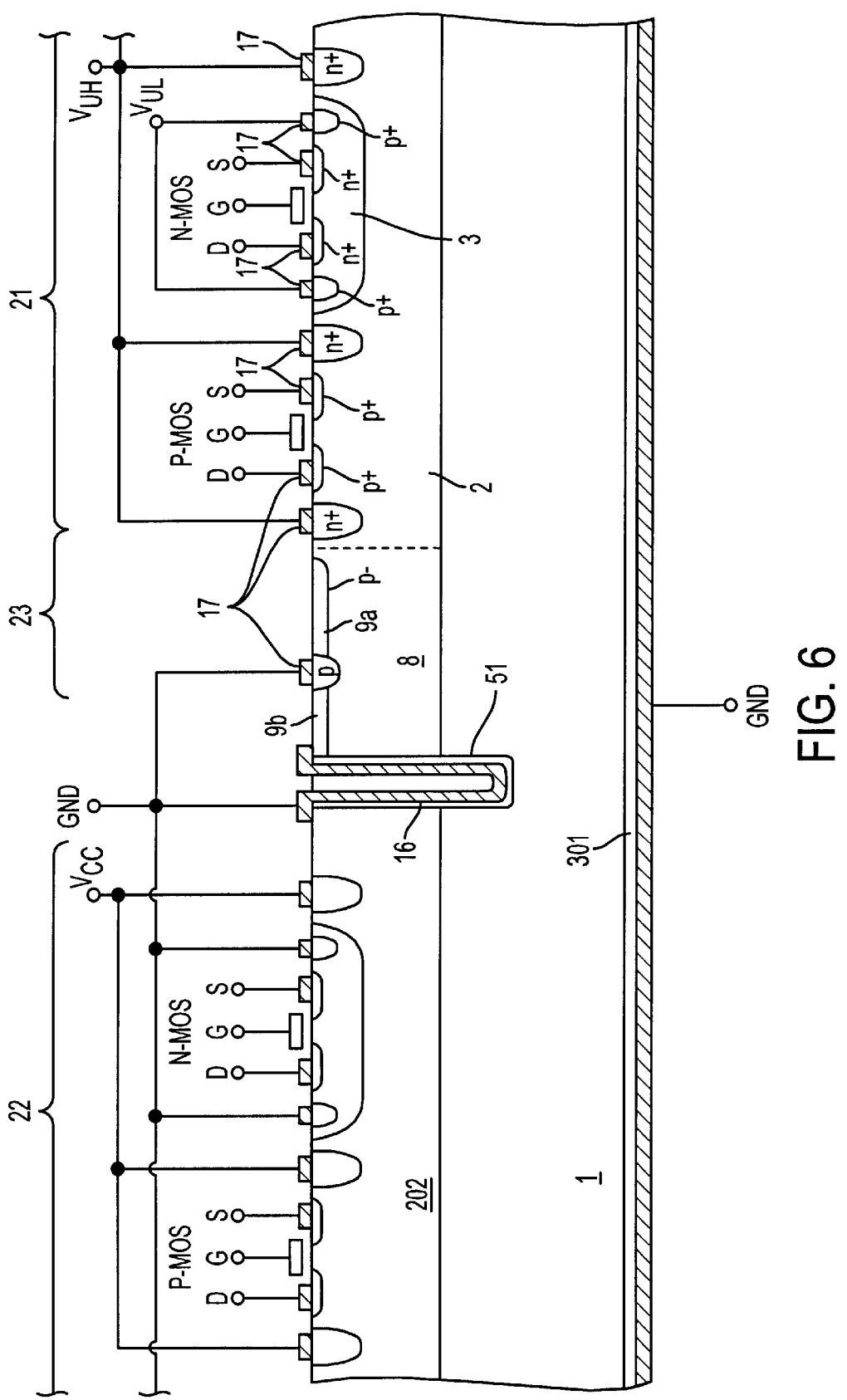
FIG. 6 is a cross-sectional view of an example of a structure of the high voltage driver integrated circuit according to a fourth aspect of an embodiment of the present invention.

FIG. 6 is a cross-sectional view of an example of the high voltage driver integrated circuit according to a fourth aspect of an embodiment of the present invention.

The structure of an integrated circuit according to the fourth aspect of embodiment incorporates the trench structure 7 of the first aspect of embodiment shown in FIGS. 1 and 2 into a junction isolation structure. The n-region 8 and the n-region 202 are formed by dividing a single epitaxially grown layer, and both regions are adjacent to the trench structure 7. The trench structure of the fourth aspect is the same as the one of FIG. 2. A p– region 9b is formed in the n-region 8 between the trench and an electrode 17 connecting to the ground potential. P– region 9a is formed between the electrode 17 and the region 21 to form the floating-potential-base circuit. The p– region 9b facilitates to deplete the portion of the n-region 8 under the p– region 9b. Because a side of the p– region 9a near the region 21 to form the floating-potential-base circuit experiences a higher electric potential, the p– region 9a may be wider than the p– region 9b.

A Fifth Aspect of an Embodiment of the Invention.

Figure 7:
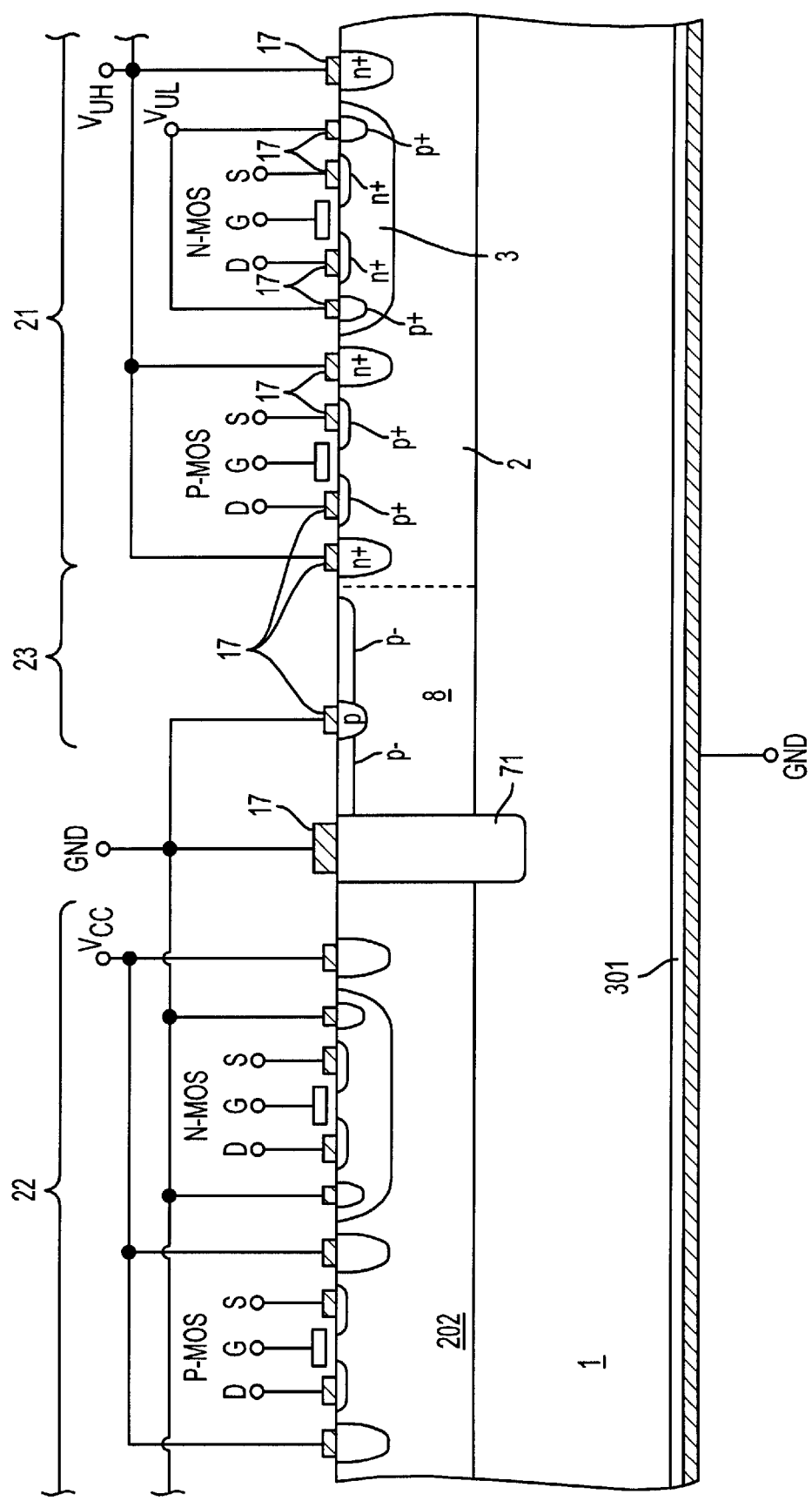
FIG. 7 is a cross-sectional view of an example of a structure of the high voltage driver integrated circuit according to a fifth aspect of an embodiment of the present invention.

FIG. 7 is a cross-sectional view of an example of the high voltage driver integrated circuit according to a fifth aspect of an embodiment of the present invention. The structure of the integrated circuit according to the fifth aspect of an embodiment of the present invention incorporates the trench structure 7 of the second aspect of embodiment shown in FIG. 4 into a junction isolation structure. The n-region 8 and the n-region 202 are formed by dividing a single epitaxially grown layer, and both regions are adjacent to the trench structure 7.

A Sixth Aspect of an Embodiment of the Invention.

Figure 8:
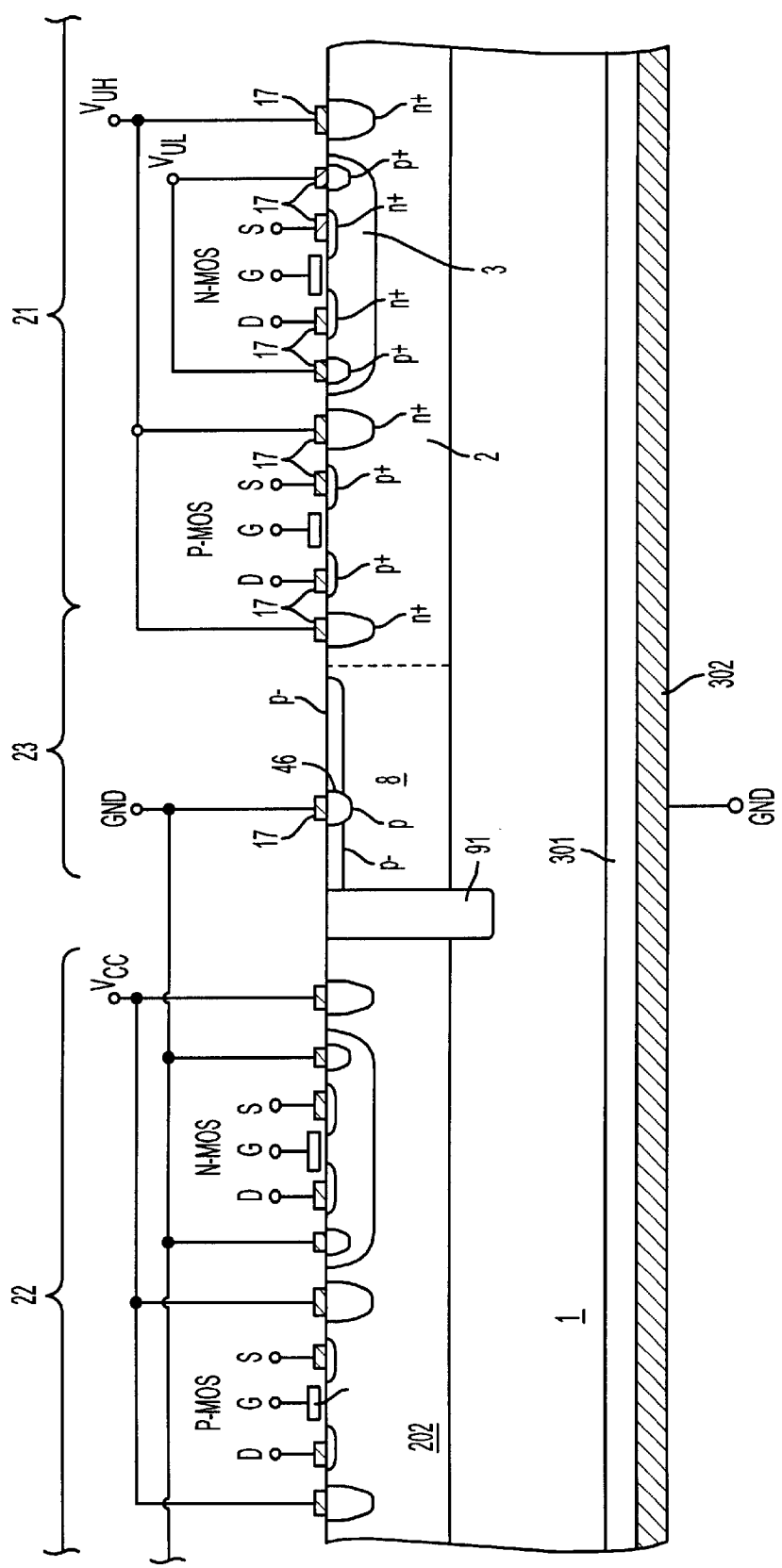
FIG. 8 is a cross-sectional view of an example of a structure of the high voltage driver integrated circuit according to a sixth aspect of an embodiment of the present invention.
Figure 9:
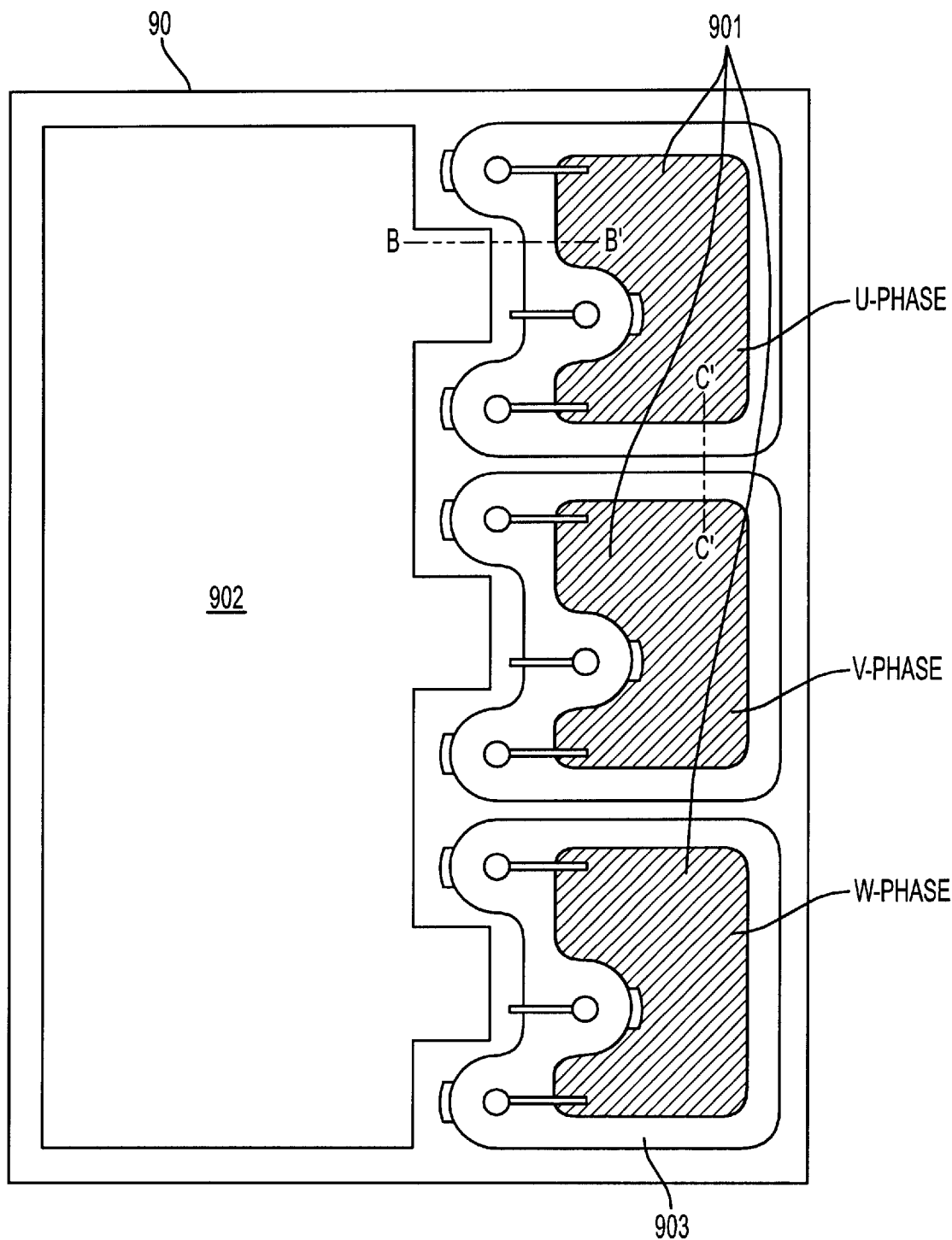
FIG. 9 is a plane view of an example of a structure of a conventional high voltage driver integrated circuit.
Figure 10:
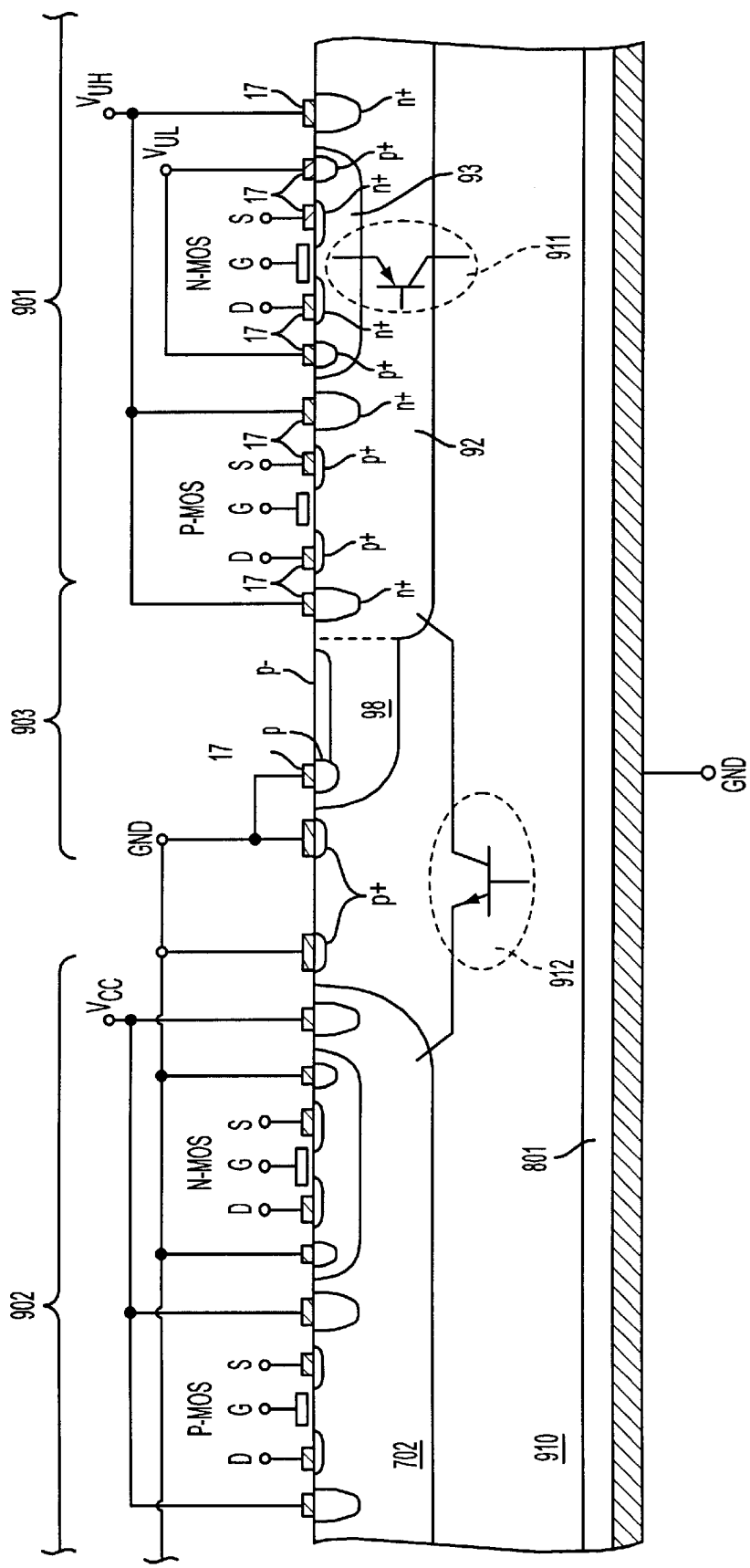
FIG. 10 is a cross-sectional view along a line B–B' of FIG. 9 showing the structure of the conventional high voltage driver integrated circuit.
Figure 11:
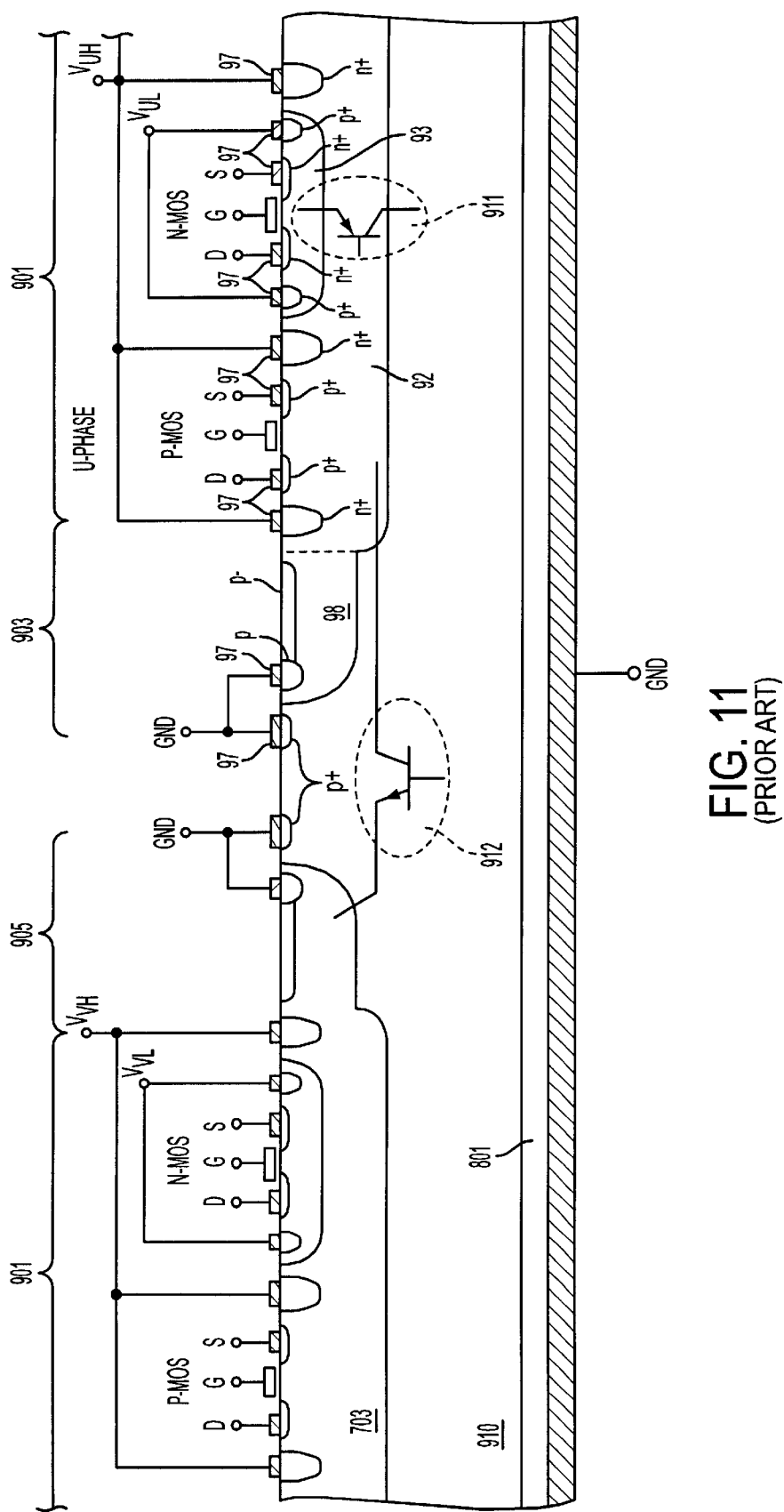
FIG. 11 is a cross-sectional view along a line C–C' of FIG. 9 showing the structure of the conventional high voltage driver integrated circuit.
Figure 12:
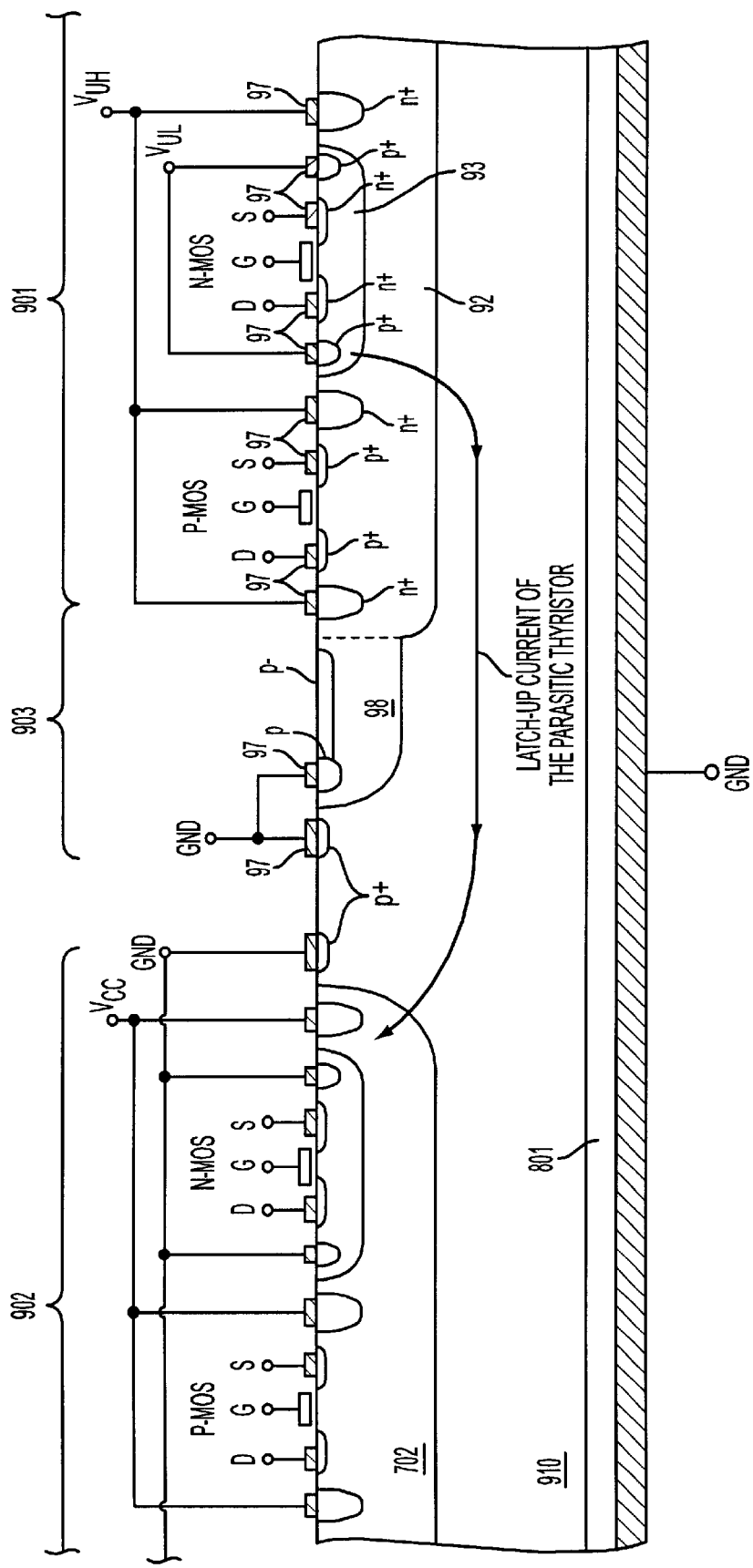
FIG. 12 is a cross-sectional view along the line B–B' of FIG. 9 showing the structure of the conventional high voltage driver integrated circuit with the example of the latch-up current inserted.
Figure 13:
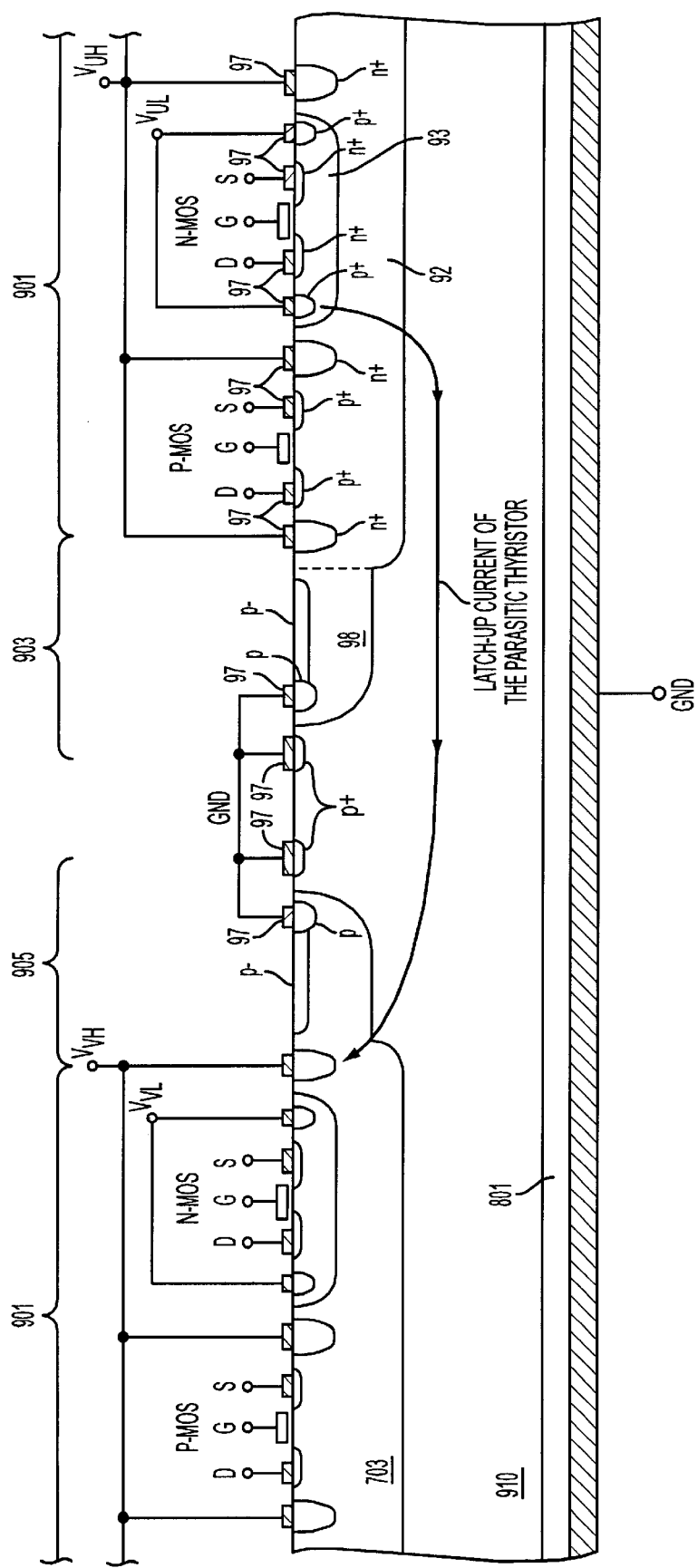
FIG. 13 is a cross-sectional view along the line C–C' of FIG. 9 showing the structure of the conventional high voltage driver integrated circuit with the example of the latch-up current inserted.
Figure 14:
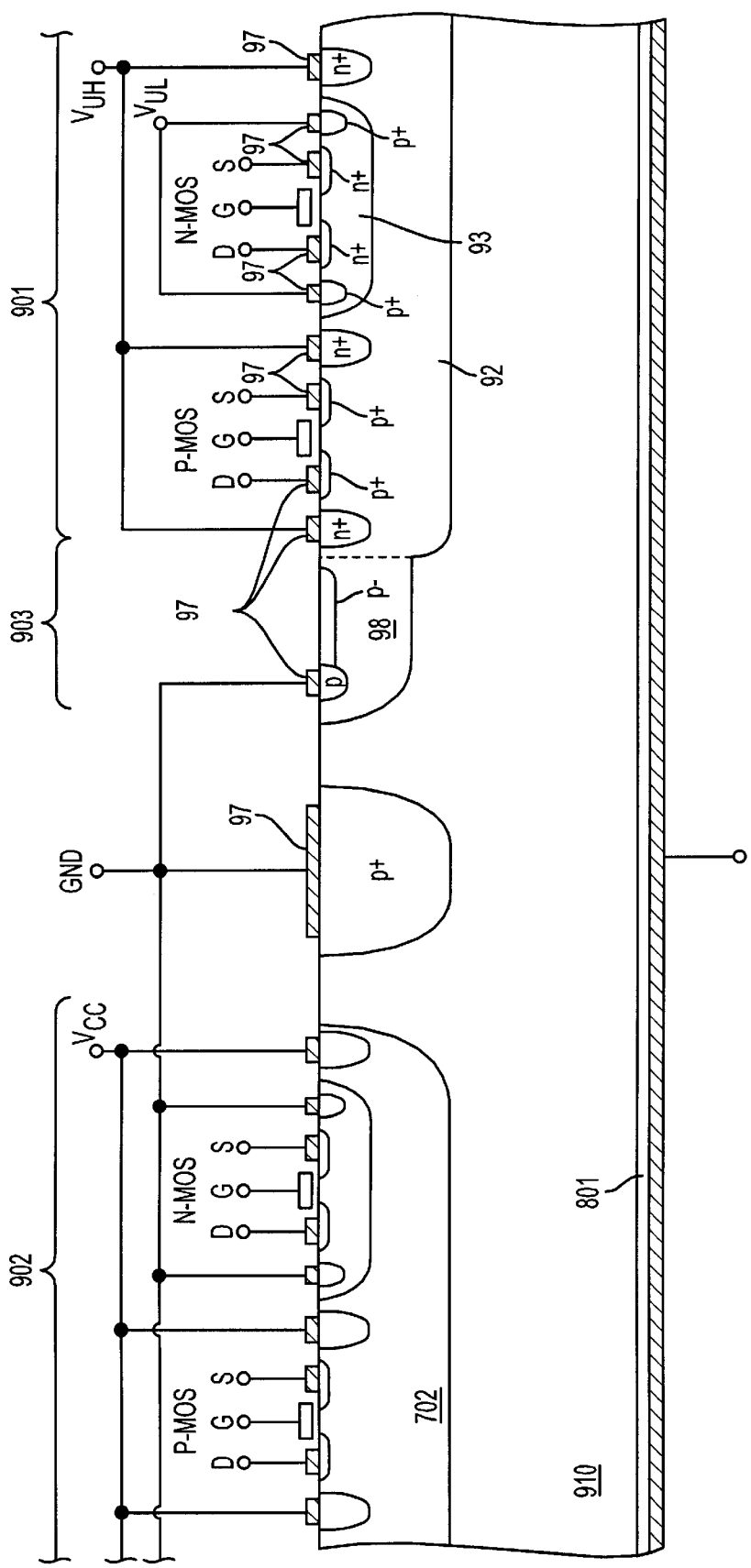
FIG. 14 is a cross-sectional view of a portion corresponding to the line B–B' of FIG. 9 of the conventional high voltage driver integrated circuit, in which a means to avoid the latch-up current is provided.

FIG. 8 is a cross-sectional view of an example of a high voltage driver integrated circuit according to a sixth aspect of an embodiment of the present invention.

The structure of the integrated circuit according to the sixth aspect of an embodiment of the present invention incorporates the trench structure 7 of the third aspect of embodiment shown in FIG. 5 into a junction isolation structure. The n-region 8 and the n-region 202 are formed by dividing a single epitaxially grown layer, and both regions are adjacent to the trench structure 7.

The conductivity types, an n type and a p type, of the MOS structure regions in each embodiment described above may be simultaneously reversed.

Accordingly, a trench structure is provided between regions at different electrical potentials in a high voltage driver IC. The trench structure prevents an unfavorable phenomenon observed in a conventional high voltage driver IC, in which a parasitic transistor or a parasitic thyristor formed in the IC causes a parasitic action, that is, a bipolar action or a latch-up action due to a rapid voltage change accompanied by a switching action of a high power semiconductor device, such as an IGBT. Therefore, a high voltage driver IC is obtained that hardly brings about a malfunction or device destruction.

Although the preferred embodiment of the present invention has been described, it will be understood by those skilled in the art that the present invention should not be limited to the described preferred embodiment, but various changes and modifications can be made within the spirit and the scope of the present invention. Accordingly, the scope of the present invention is not limited within the described range but the following claims.

What is claimed is:

1. A semiconductor device, comprising:
   a semiconductor substrate of a first conductivity type;
   a semiconductor region of a second conductivity type on the substrate and having a first region and a second region;
   a trench structure formed on a surface of the semiconductor region extending into the substrate, the trench structure dividing the semiconductor region into the first region and the second region;
   a first conductivity type MOS comprising a drain region of the first conductivity type and a source region of the first conductivity type formed in at least one of the first region and the second region; and
   a second conductivity type MOS comprising a drain region of the second conductivity type and a source region of the second conductivity type, the drain region and the source region being formed in a first conductivity type region formed in the at least one of the first region and the second region.

2. The semiconductor device according to claim 1, wherein the trench structure is connected to a lowest electrical potential of the semiconductor device.

3. The semiconductor device according to claim 2, wherein the trench structure comprises a highly doped polysilicon of the first conductivity type making an electrical contact with the substrate and electrically connecting to the lowest electrical potential.

4. The semiconductor device according to claim 1, wherein a base electrical potential of the first region differs from a base potential of the second region.

5. The semiconductor device according to claim 4, wherein the trench structure comprises a dielectric that fills a trench of the trench structure.

6. The semiconductor device according to claim 1, further comprising
   a high voltage junction terminating structure adjacent to the first region and the second region having a base electrical potential as a floating potential and a terminating structure contacting the trench structure.

7. The semiconductor device according to claim 6, wherein the trench structure comprises a dielectric that fills a trench of the trench structure.

8. The semiconductor device according to claim 1, wherein the trench structure comprises a dielectric that fills a trench of the trench structure.

9. A semiconductor device, comprising:
   a semiconductor substrate of a first conductivity type;
   a first semiconductor region of a second conductivity type formed in a surface region of the substrate;
   a second semiconductor region of the second conductivity type formed in another surface region of the substrate;
   a trench structure formed on the substrate between the first semiconductor region and the second semiconductor region at a depth deeper than the first semiconductor region and the second semiconductor region;
   a first conductivity type MOS comprising a drain region of the first conductivity type and a source region of the first conductivity type formed in at least one of the first semiconductor region and the second semiconductor region; and
   a second conductivity type MOS comprising a drain region of the second conductivity type and a source region of the second conductivity type, the drain region and the source region being formed in a first conductivity type region formed in the at least one of the first semiconductor region and the second semiconductor region.

10. The semiconductor device according to claim 9, wherein the trench structure is connected to a lowest electrical potential of the semiconductor device.

11. The semiconductor device according to claim 10, wherein the trench structure comprises a highly doped polysilicon of the first conductivity type making an electrical contact with the substrate and electrically connecting to the lowest electrical potential.

12. The semiconductor device according to claim 9, wherein a base electrical potential of the first semiconductor region differs from a base potential of the second semiconductor region.

13. The semiconductor device according to claim 12, wherein the trench structure comprises a dielectric that fills a trench of the trench structure.

14. The semiconductor device according to claim 9, further comprising
   a high voltage junction terminating structure surrounding and adjacent to the first semiconductor region and the second semiconductor region having a base electrical potential as a floating potential and a terminating structure detached the trench structure.

15. The semiconductor device according to claim 12, wherein the trench structure comprises a dielectric that fills a trench of the trench structure.

16. The semiconductor device according to claim 9, wherein the trench structure comprises a dielectric that fills a trench of the trench structure.

* * * * *